United States Patent [19]

Sakakibara et al.

[11] Patent Number: 5,072,277
[45] Date of Patent: Dec. 10, 1991

[54] SEMICONDUCTOR DEVICE WITH GRADUALLY VARYING DOPING LEVELS TO COMPENSATE FOR THICKNESS VARIATIONS

[75] Inventors: Toshio Sakakibara, Nishio; Masami Yamaoka, Anjo, both of Japan

[73] Assignee: Nippondenso Co., Ltd., Kariya, Japan

[21] Appl. No.: 549,299

[22] Filed: Jul. 9, 1990

[30] Foreign Application Priority Data

Jul. 10, 1989 [JP] Japan .................................. 1-178639
May 11, 1990 [JP] Japan .................................. 2-122199

[51] Int. Cl.$^5$ ..................... H01L 27/02; H01L 29/10; H01L 27/01; H01L 27/13
[52] U.S. Cl. .................................. 357/42; 357/23.4; 357/23.7; 357/90
[58] Field of Search ....................... 357/23.4, 23.7, 42, 357/90

[56] References Cited

U.S. PATENT DOCUMENTS

| | | | |
|---|---|---|---|
| 4,593,453 | 6/1986 | Tam et al. | 357/42 |
| 4,621,276 | 11/1986 | Malhi | 357/42 |
| 4,656,492 | 4/1987 | Sonami et al. | 357/233 |
| 4,751,561 | 6/1988 | Jastrzebski | 357/42 |
| 4,772,927 | 9/1988 | Saito et al. | 357/42 |
| 4,821,090 | 4/1989 | Yokoyama | 357/43 |
| 4,889,825 | 12/1989 | Pafillo | 357/42 |

FOREIGN PATENT DOCUMENTS 62-76645 4/1987 Japan .
62-169467 7/1987 Japan .

OTHER PUBLICATIONS

Kamins, "Silicon Integrated Circuits Using Beam-Recrystallized Polysilicon", Hewlett-Packard Journal, Aug. 1982, pp. 10–13.
"CMOS Semiconductor Structure Without Latch-up and Method of Fabrication Thereof", IBM Technical Disc. Bulletin, vol. 27, No. 12, 5/1985, pp. 6968–6970.
"Method to Fabricate CMOS on Insulator", IBM Technical Disclosure Bulletin, vol. 28, No. 7, Dec. 1985, pp. 3120–3122.
Spangler et al., "A Technology for High-Performance Single-Crystal Silicon-on-Insulator Transistors", IEEE Electron Device Letters, vol. EDL-8, No. 4, Apr. 1987, pp. 137–139.
Nakagawa et al., "High Voltage", New Driver IC Technique Based on Silicon Water Direct-Bonding (SDB), 1988 Record (Apr. 1988), pp. 1325–1329, IEEE PESC.
Malhi et al., "Novel SOI CMOS Design Using Ultra Thin Near Intrinsic Substrate", IEEE Technical Digest of IEDM, 1982, pp. 107–110.

Primary Examiner—Andrew J. James
Assistant Examiner—Cynthia S. Deal
Attorney, Agent, or Firm—Cushman, Darby & Cushman

[57] ABSTRACT

A semiconductor device is provided which comprises a single crystalline substrate having a main surface, an insulating layer formed on the main surface of the single crystalline substrate, and a semiconductor region of a single crystal formed on the insulating layer, wherein the semiconductor region has top and bottom surfaces and a thickness of not more than 6 μm and an impurity is doped in the semiconductor region from the top to bottom surfaces thereof, a concentration of the impurity gradually decreasing from the top to bottom surfaces, whereby the semiconductor region is made a first conductivity type by the doped impurity. The semiconductor device further comprises an insulating gate type field effect transistor including source and drain regions in the semiconductor region, the source and drain regions having a conductive type opposite to that of the first conductivity type, and further there is provided a process for manufacturing such a semiconductor device.

15 Claims, 10 Drawing Sheets

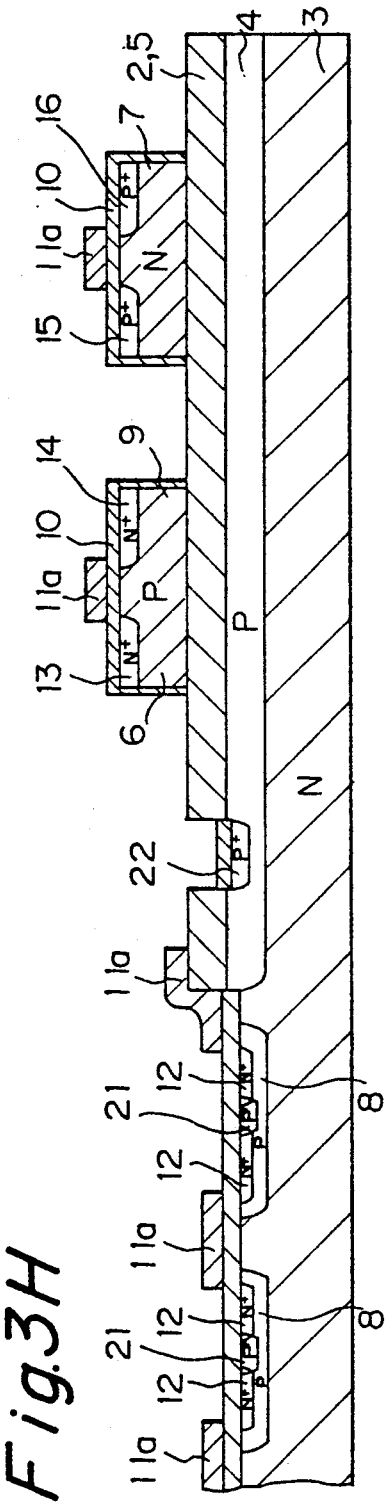
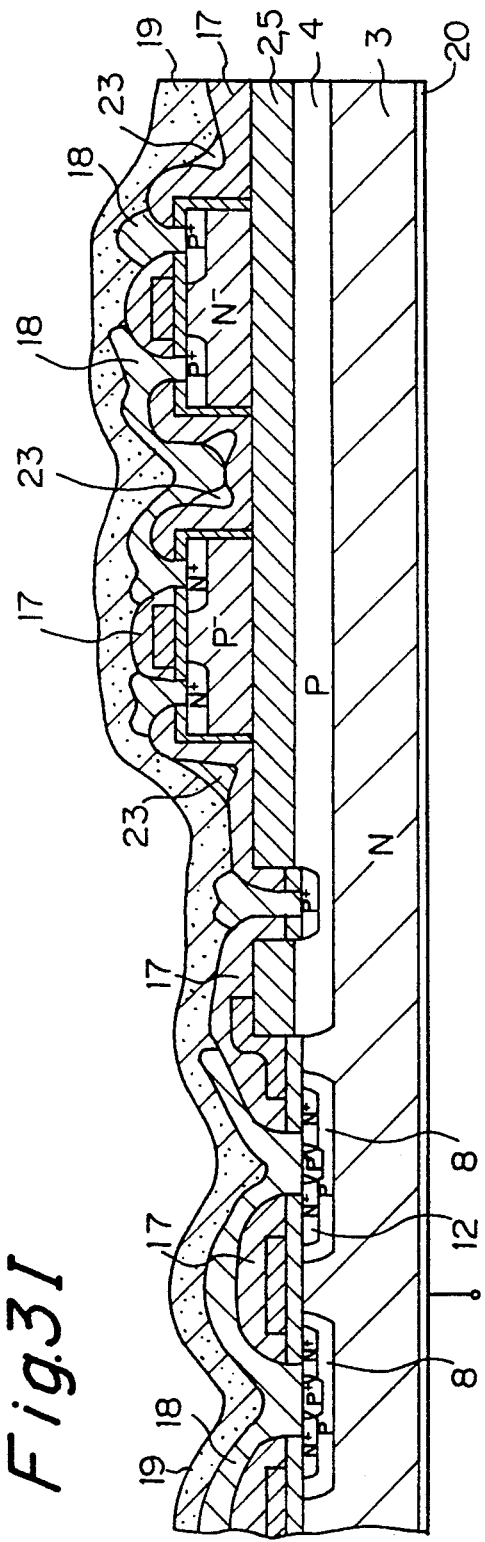
Fig.3H
Fig.3I

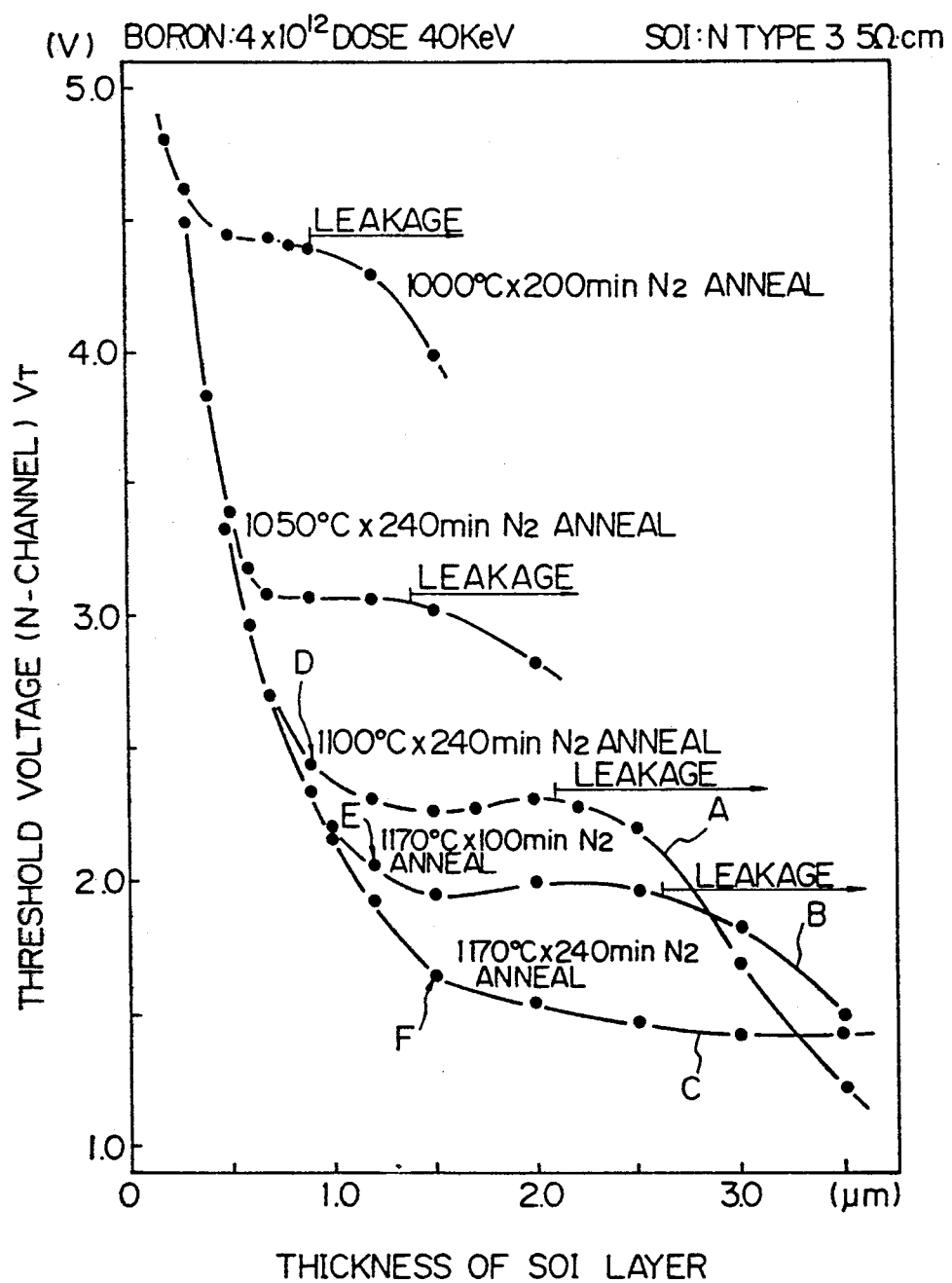

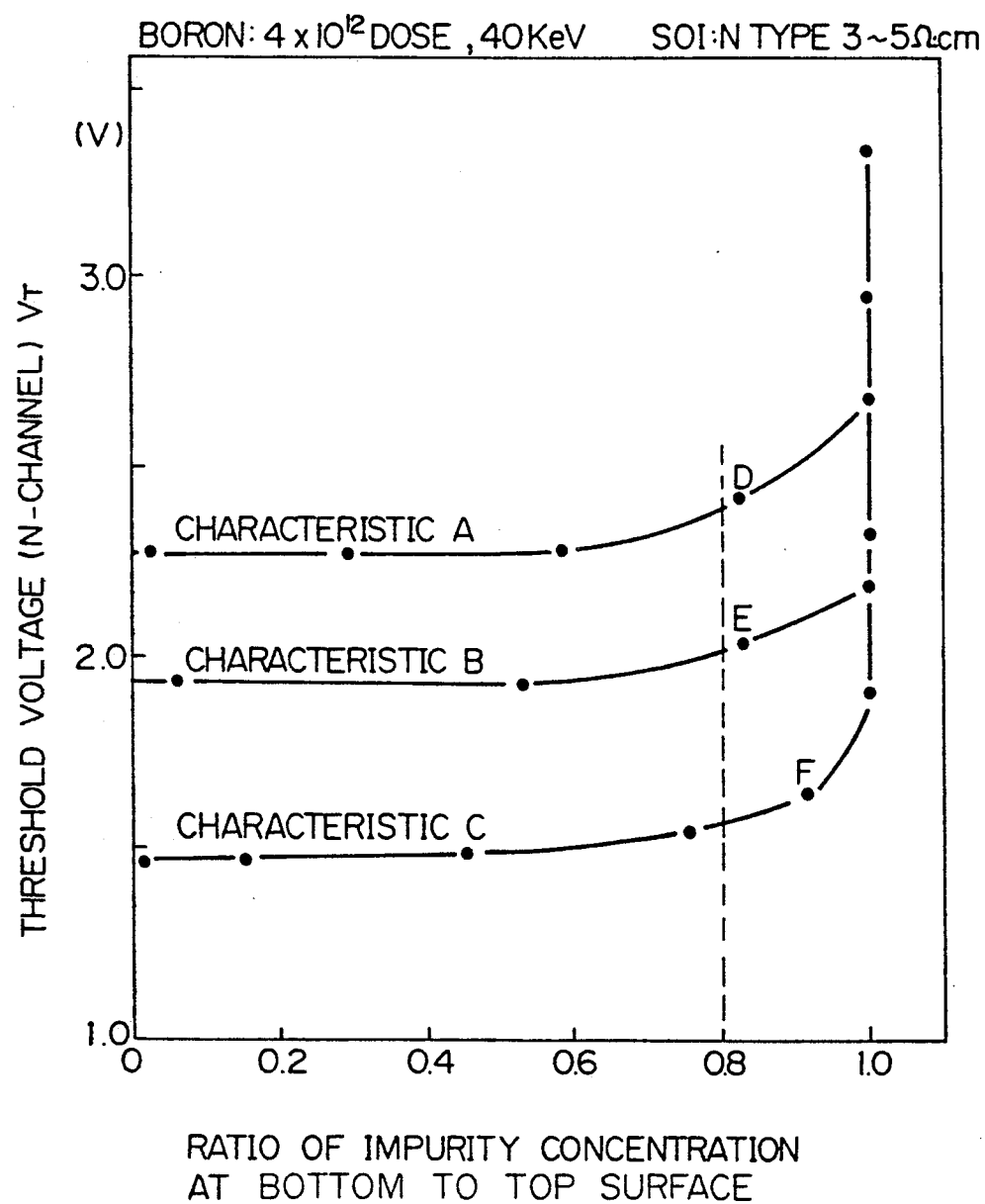

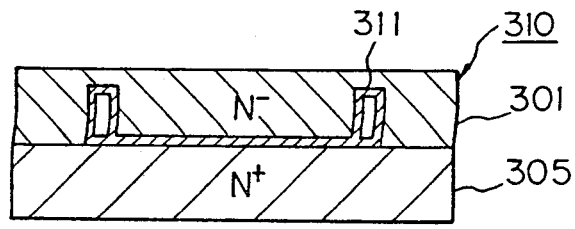
Fig.7D
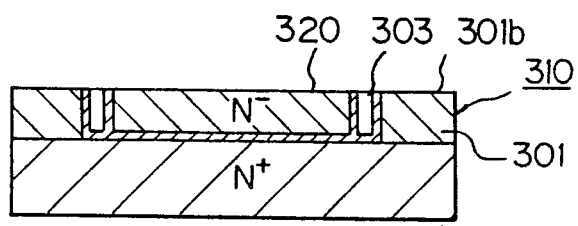
Fig.7E
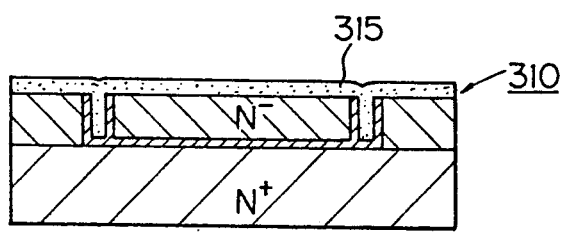
Fig.7F
Fig.7G
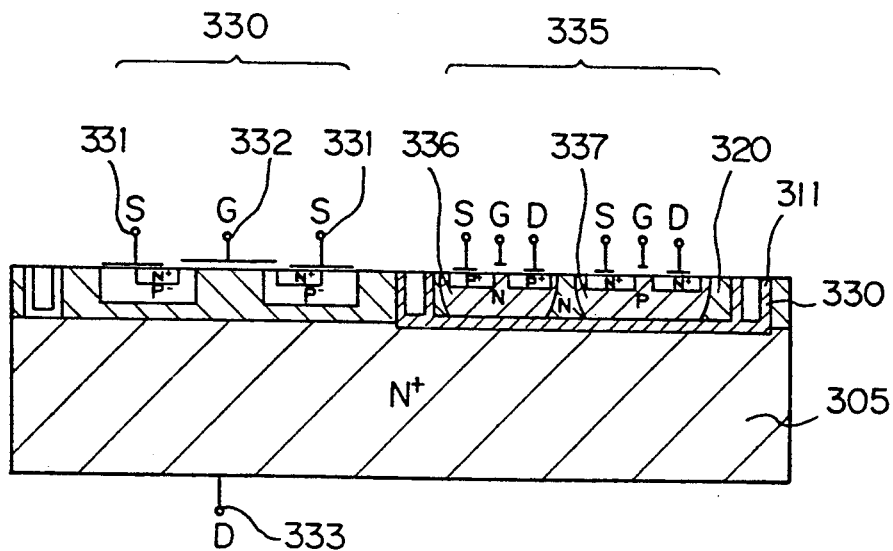

SEMICONDUCTOR DEVICE WITH GRADUALLY VARYING DOPING LEVELS TO COMPENSATE FOR THICKNESS VARIATIONS

BACKGROUND OF THE INVENTION

1. Field of the Invention

The present invention relates to a semiconductor device having an SOI (Semiconductor On Insulator) structure, and a process for manufacturing same.

2. Description of the Related Art

Heretofore, various structures for isolating elements in a semiconductor chip have been proposed, to separate power elements such as a DMOS transistor and a CMOS transistor when composing a control or logic part, and an example thereof is described in Japanese Unexamined Patent Publication (Kokai) No. 62-76645. As illustrated in FIG. 1, two wafers, i.e., a first semiconductor substrate 100 and a second semiconductor substrate 101, are bonded with an insulating layer 102 inserted therebetween. The first semiconductor substrate 100, insulating layer 102, and second semiconductor substrate 101 are locally etched, in this order, to expose a part of the second semiconductor substrate 101, an epitaxial layer 103 is formed on the exposed second semiconductor substrate 101 at the etched part, and a DMOS transistor is formed in the epitaxial layer 103. To isolate the remaining part of the first semiconductor substrate 100 other than the etched part, an isolation element 104 is formed by the trench technique.

The reason why the structure of "the epitaxial layer on the exposed second semiconductor substrate 101 at the etched part" is adopted, although the cost of this structure is high, is that the first semiconductor substrate 100 can be ground after the bonding of the wafers, but the first semiconductor substrate 100, i.e., an SOI layer, cannot be made thin due to a large dispersion of the thickness, typically ±5.0 µm, when polished by a conventional polishing method. Accordingly, the first semiconductor substrate 100 or polished SOI layer is, for example, 20 µm thick, in Japanese Unexamined Patent Publication (Kokai) No. 62-76645, and therefore, the etched part has a deep step such as 20 µm, which prevents a later formation of an element on the exposed second semiconductor substrate. The reason why the structure of "an element isolation 104 formed by the trench technique" is adopted is similar. Namely, since the SOI layer is as thick as 20 µm, a deep step is formed if an island isolation is adopted, and the deep step prevents the formation of another element. Further, the steps of the epitaxial growth and trench isolation processes are complex, and a large number of process steps is required, thereby further increasing costs.

Recently, the polishing technique has been improved and a dispersion of a layer thickness after polishing can be reduced to about ±0.5 µm, which allows a semiconductor substrate to be polished to a considerably thin thickness. The limit of a focusing depth of an alignment device is currently 6 µm, and a layer island having a step height of 6 µm can be planarized by the use of the TEOS (Tetra Ethyl Ortho-Silicate) layer or SOG (Spin On Glass) layer technique. Accordingly, in consideration of the above prior art, the inventors manufactured a semiconductor device having a semiconductor layer (SOI layer) less than 6 µm thick, on an insulating layer. By reducing the thickness of the SOI layer to less than 6 µm, a height of a step formed when isolated by an island isolation is so low that an epitaxial layer is not necessary, and trench forming is not necessary because of the island isolation or a time required for the trench forming step is shortened even if an isolation trench must be formed, which improves the productivity.

Nevertheless, a problem has been found during the investigation and development of the above semiconductor devices. This problem did not arise in the prior art because of a thick thickness of an SOI layer, but it appears that the characteristics of an semiconductor element are deteriorated when the thickness of an SOI layer is made less than 6 µm and an insulating gate type field effect transistor such as an MOS transistor is formed in the SOI layer. This is explained with reference to FIGS. 2A and 2B. FIG. 2A shows a section of an MOS transistor formed on the SOI layer, and FIG. 2B shows the impurity concentration profile of a section cut along the line A—A of FIG. 2A. In FIG. 2A, an N-type SOI layer 201 having a thickness of less than 6 µm is formed on a field oxide layer 200, a P$^-$-type region 202 is formed by introducing a P-type impurity into the N-type SOI layer 201 from the surface thereof, source and drain regions 203 and 204 are formed in the P$^-$-type region 202, and a gate electrode 205 is formed on an insulating layer above the SOI layer 201. The P-type impurity does not reach the bottom of the SOI layer 201, and therefore, a portion adjacent to the bottom remains N-type and an NPN-type parasitic transistor is formed from an N$^-$-type region 206 between the P$^-$-type region 202 and the source region 203, since a distance between the N-type region 206 and the source region 203 is short due to a thin thickness of the SOI layer 201. This parasitic transistor, however, causes a current leakage when the MOS transistor is in a cut-off state.

Therefore, the object of the present invention is to provide a semiconductor device having an SOI structure in which a thickness of a semiconductor region of a single crystal formed on an insulating layer is made thinner, and the characteristics of an element formed in the semiconductor region are improved, and a process for manufacturing such a semiconductor device.

SUMMARY OF THE INVENTION

The above and other objects are attained by providing a semiconductor device comprising a single crystalline substrate having a main surface, an insulating layer formed on the main surface of the single crystalline substrate, and a semiconductor region of a single crystal formed on the insulating layer, wherein the semiconductor region has top and bottom surfaces and a thickness of not more than 6 µm, and an impurity is doped in the semiconductor region from the top to bottom surfaces thereof, a concentration of the impurity gradually decreasing from the top to bottom surfaces, whereby the semiconductor regions are made a first conductivity type by the doped impurity, the semiconductor device further comprising an insulating gate type field effect transistor including source and drain regions having a conductive type opposite to that of the first conductivity type in the semiconductor region.

The present invention further provides a process for manufacturing a semiconductor device, comprising the steps of: bonding a main surface of a first single crystalline substrate having a first conductivity type and a thickness and a main surface of a second single crystalline substrate with an insulating layer inserted therebetween, making the thickness of the first single crystalline substrate thin to not more than 6 μm to form a semiconductor region having top and bottom surfaces, introducing an impurity of a second conductivity type opposite to the first conductivity type into the semiconductor region from the top to bottom surfaces thereof to form an impurity-doped region having an impurity concentration distribution gradually decreasing from the top to bottom surfaces, and forming an insulating gate type field effect transistor by including a formation of source and drain regions having the first conductivity type in the impurity-doped region.

In accordance with the present invention, the thickness of the semiconductor region is not more than 6 μm, and therefore, steps caused by an island isolation are not high, which eliminates the process required for deep steps and makes the manufacturing process simple. Even if a trench isolation is adopted, the time required for the trench isolation is shortened and the productivity is improved. In the semiconductor region having a thin thickness, an impurity is doped from the top to bottom surfaces of the region, and source and drain regions of an insulating gate type field effect type transistor are formed in that impurity doped region, which prevents a formation of a parasitic transistor and a current leakage there.

If a ratio of an impurity concentration at the bottom to top surfaces of the impurity doped region is made not more than 0.8, the thickness of the semiconductor region is sufficiently thick in comparison with the concentration of the impurity doped in this semiconductor region and, therefore, even if the thickness of the semiconductor region is varied to some extent, the impurity concentration at the top surface of the region is not varied and the threshold voltage of the insulating gate type field effect type transistor is made stable.

When an element having a current path in the direction of the substrate thickness with an electrode on the other main surface is formed in the single semiconductor substrate, the conductivity type of the substrate being made a first conductivity, and the conductivity of a portion of the substrate adjacent to the main surface below the semiconductor region being made a second conductivity type opposite to the first conductivity, the semiconductor regions are not affected by the potential variation of the semiconductor element formed in the semiconductor substrate.

When a plurality of semiconductor regions are formed and the conductivity type of a gate electrode of an insulating gate type field effect transistor formed to the semiconductor regions is made a first conductivity type, and the same conductivity type as that of the first single crystalline semiconductor substrate, when introducing a second conductivity type impurity into the semiconductor regions, the first conductivity type of the semiconductor regions can be converted to the second conductivity type by introducing the impurity at a higher concentration, which is advantageous to the design process.

BRIEF DESCRIPTION OF THE DRAWINGS

FIGS. 3A–3I are sectional views of an SOI type semiconductor device as an embodiment of the present invention, during the main steps of manufacturing;

FIGS. 4A and 4B show a relationship between the threshold voltage and the thickness of an SOI layer;

FIG. 5 shows a relationship between the threshold voltage and the ratio of the impurity concentration at the bottom to top surfaces;

FIGS. 7A–7G are sectional views of an SOI type semiconductor device of another embodiment of the present invention, during the main steps of manufacturing the same.

DESCRIPTION OF THE PREFERRED EMBODIMENTS

FIGS. 3A–3I illustrate the steps of manufacturing a semiconductor device as an embodiment of the present invention.

Figure 1:
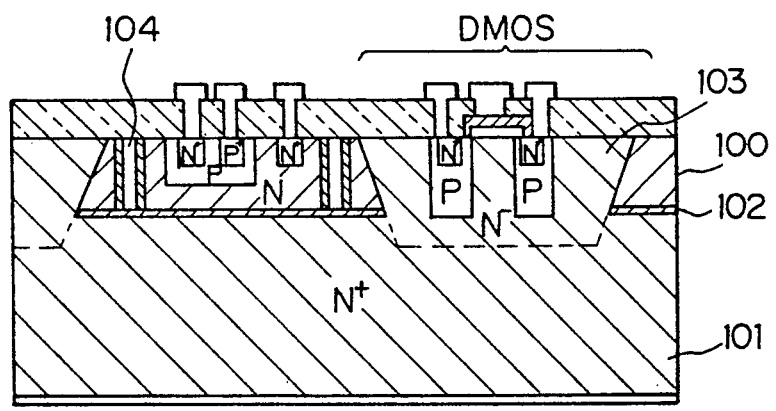
FIG. 1 is a sectional view of an SOI type semiconductor device of the prior art.
Figure 2A:
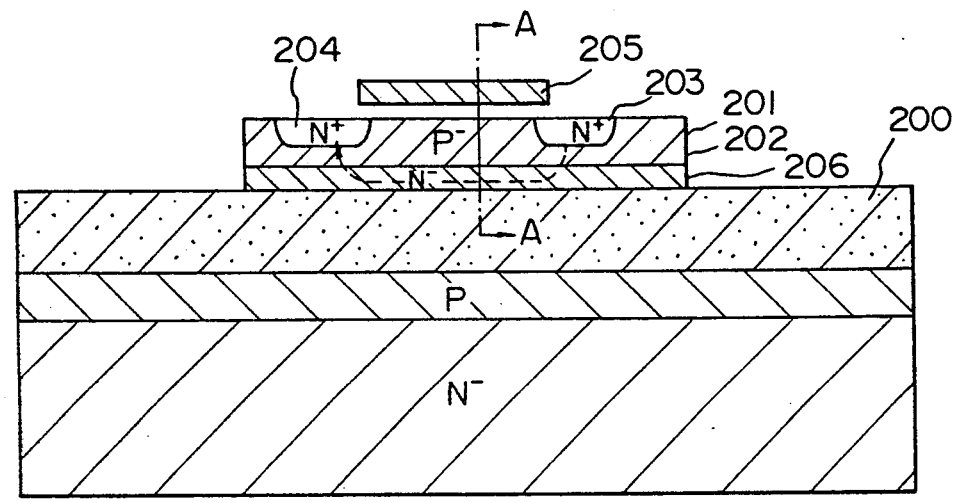
FIG. 2A is a sectional view of a semiconductor device illustrating an occurrence of a current leakage.
Figure 2B:
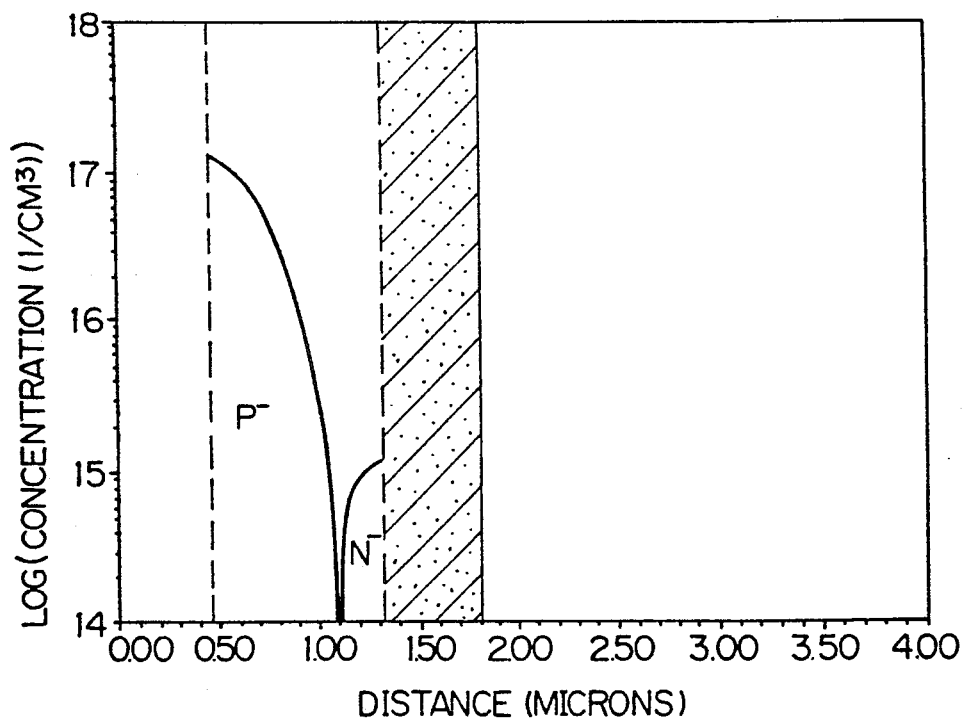
FIG. 2B is an impurity concentration profile taken along the line A—A in FIG. 2A.
Figure 3A:
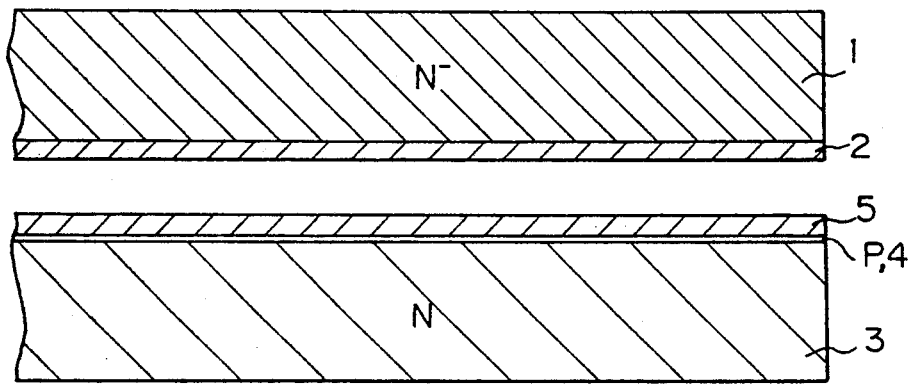

Referring to FIG. 3A, a main surface of a first single crystalline substrate 1 having an N-type conductivity is oxidized to form an oxide layer 2, and a P-type conductivity type impurity such as B (boron) is wholly introduced into a second single crystalline substrate 3 having an N-type conductivity, from a main surface thereof, to form a P-type region 4, and the surface of the P-type region 4 is oxidized to form an oxide layer 5.

Figure 3B:
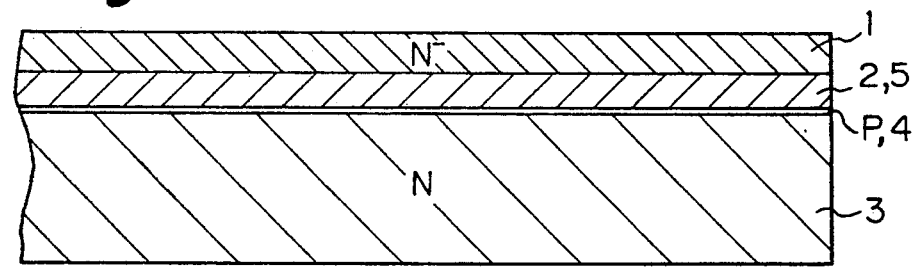

Referring to FIG. 3B, the oxide layers 2 and 5 of the first and second single crystalline substrates 1 and 3 are faced and bonded together, and the first single crystalline substrate 1 is polished from the opposite main surface side thereof to a thickness of not more than 6 μm, for example, 1.5–2.5 μm.

Figure 3C:
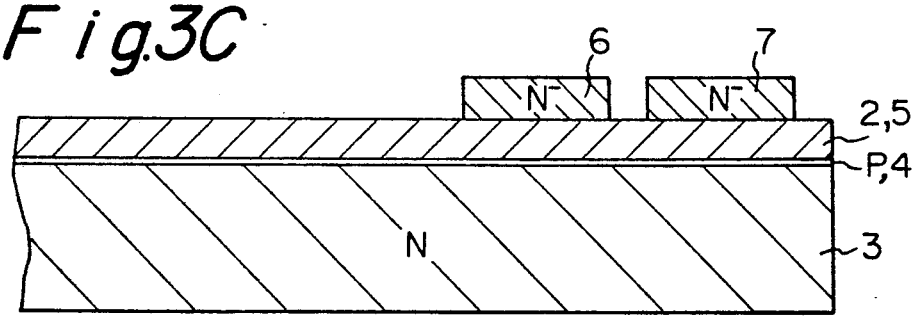

Referring to FIG. 3C, the first single crystalline substrate 1 is locally etched to form island regions 6 and 7 corresponding to the semiconductor regions of the present invention.

Figure 3D:
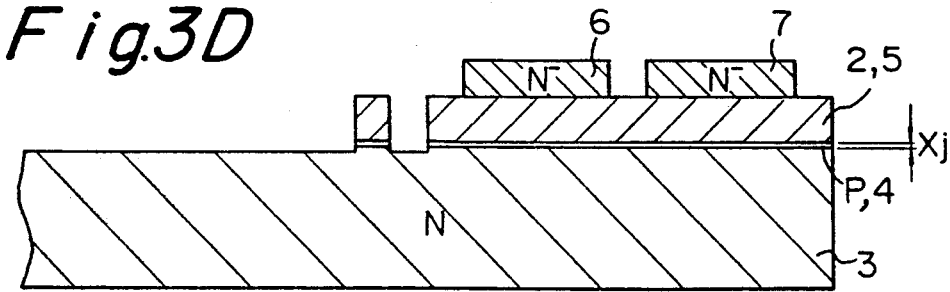

Referring to FIG. 3D, the insulating layers 2 and 5 at areas where a DMOS transistor (Double Diffusion Metal Oxide Semiconductor) and a region in contact with the P-type region 4 are later formed are locally dry or wet etched to expose the second single crystalline substrate 3, and the P-type region 4 at the exposed areas is then completely removed by an RIE (reactive ion etching) or a wet etching, etc. If the depth $x_j$ of the P-type region 4 is more than 1 μm, a step formed after the removal of the P-type region 4 becomes disadvantageously severe, and therefore, the depth $x_j$ of the P-type region 4 should be not more than 1 μm. The bonding of the wafers should be carried out at a temperature not higher than 1110° C., to prevent a deepening of the depth $x_j$ of the P-type region 4.

Figure 3E:
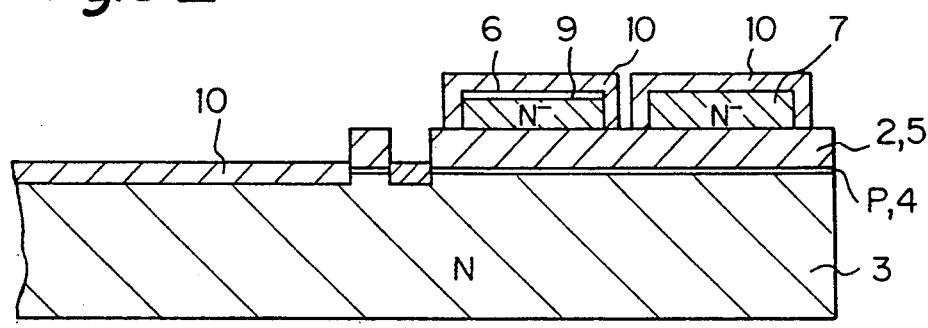

Referring to FIG. 3E, a gate oxide layer 10 is formed on the island regions 6 and 7 and the second single crystalline substrate 3 in the area where a DMOS transistor is later formed. The island region 7 where a P-type transistor is later formed and the area where a DMOS transistor is later formed are covered with a mask, and a P-type impurity such as B is introduced with the mask into a surface region of the island region 6 to form a P$^-$-type region.

Figure 3F:
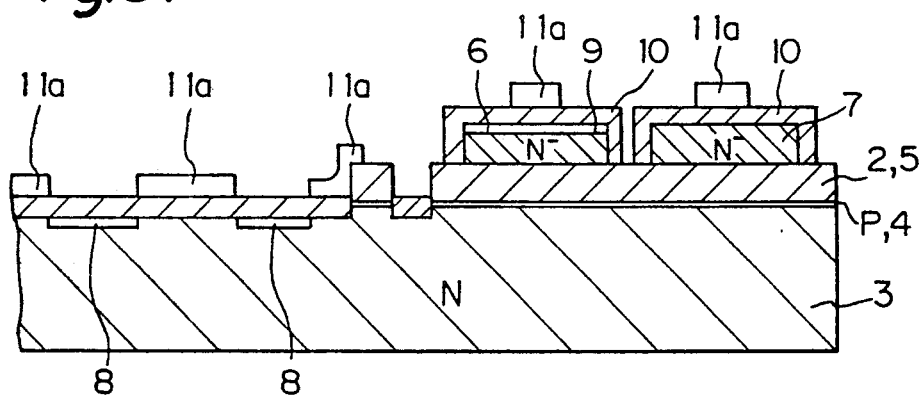

Referring to FIG. 3F, a non-doped polycrystalline silicon 11 is deposited by an LPCVD (low pressure chemical vapor deposition), and P (phosphine) is diffused into the non-doped polycrystalline silicon 11 by a vapor phase method to change the conductivity thereof to N-type. The doped polycrystalline silicon 11 is locally etched to form gate electrodes 11a of the DMOS transistor and a CMOS (complementary MOS) transistor. The area where the CMOS transistor is later made is masked with a resist and a P-type impurity such as B is ion implanted into the second single crystalline substrate 3 to form P-type well regions 8.

Figure 3G:
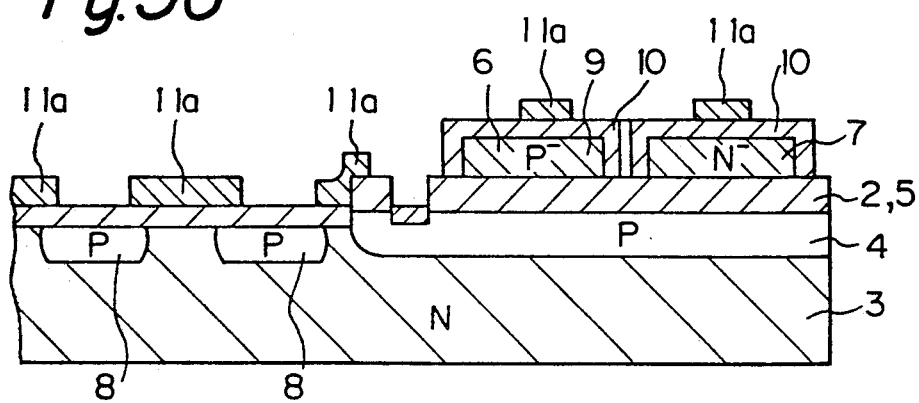

Referring to FIG. 3G, an annealing is carried out in a reducing atmosphere such as nitrogen at 1170° C. for 100 minutes, to drive in the impurities (4, 6 and 8). By this annealing, the impurity of the P-type region 9 implanted in the island region 6 reaches the bottom of the island region 6 in contact with the surface of the oxide layer 2, and the conductivity of the island region 6 is completely converted from the N-type to P-type. Simultaneously, the impurities in the P-type region 4 and the P-type well regions 8 are diffused to a predetermined depth. The impurity is distributed uniformly in the island region 7 after the annealing, since this impurity has been contained in the original single crystalline substrate 1, but the impurity is distributed in the island region 6 with a concentration inclination gradually decreasing from the top to bottom surfaces of the island region 6, since that impurity was diffused from a portion adjacent to the top surface of the island region 6 toward the bottom surface.

Referring to FIG. 3H, the area where a P-type channel transistor is later made and certain areas of the DMOS transistor are masked with a resist, and P (phosphorus) is then ion implanted to form source regions 12 in the P-type well region 8 and source and drain regions 13 and 14 of an N-type channel transistor. The above resist is removed and certain areas of the DMOS transistor and the N-type channel transistor are masked with another resist, and B (boron) is then ion implanted to form P+-type source and drain regions 15 and 16 of the P-type channel transistor and P+-type bias regions 21 and 22 of the P-type well region 8 and the P-type region 4.

Referring to FIG. 3I, an interlayer insulating layer 17 of BPSG (boron phosphorus silica glass) is deposited and annealed at 950° C. for 20 minutes, for a reflow, and the steps of the island regions 6 and 7 are planarized by an SOG or TEOS layer 23, windows are then opened in the interlayer insulating layer 17 and an Al (aluminum) layer is deposited and patterned to electrodes 18, a surface protecting layer 19 of silicon nitride is formed entirely over the Al electrodes 18 and the interlayer insulating layer 17 by a plasma CVD and is locally etched to open windows for pads, and finally, an electrode 20 is formed on the opposite side of the second single crystalline substrate 3 as a drain electrode of the DMOS transistor.

In this embodiment, since the thickness of the islands 6 and 7 is made sufficiently thin, i.e., not more than 6 $\mu$m, the steps between transistors of the CMOS transistors or between the CMOS transistors and other transistors are low enough that a trench for electrically isolating each of the P-type and N-type channel transistors or the other transistors becomes unnecessary, and the step between the CMOS transistor and the DMOS transistor is low enough that an epitaxial layer grown on the second single crystalline substrate 3 to form the DMOS transistor therein becomes unnecessary. Therefore, in this embodiment, a trench or an epitaxial layer, which is necessary in a conventional process, becomes unnecessary, and thus the process steps can be simplified and the manufacturing costs reduced. Note that layer steps not more than 6 $\mu$m high can be easily planarized by a TEOS or SOG layer process, and that a conventional alignment device can be used without modification, since a conventional alignment device allows a focusing with a depth of about 6 $\mu$m.

Also, since the impurity, implanted in the island region 6, of the P-type region 9 is sufficiently driven in to reach the bottom surface of the island region 6, a parasitic transistor is not formed in the island region 6, thus preventing a current leakage.

Note that a depth of an impurity diffusion enabled by the driving-in is normally about 6 $\mu$m, and in the present invention, the thickness of the island regions 6 and 7 is made not more than 6 $\mu$m, and therefore, the impurity can be diffused to the bottom surface of the island region 5.

Figure 4B:
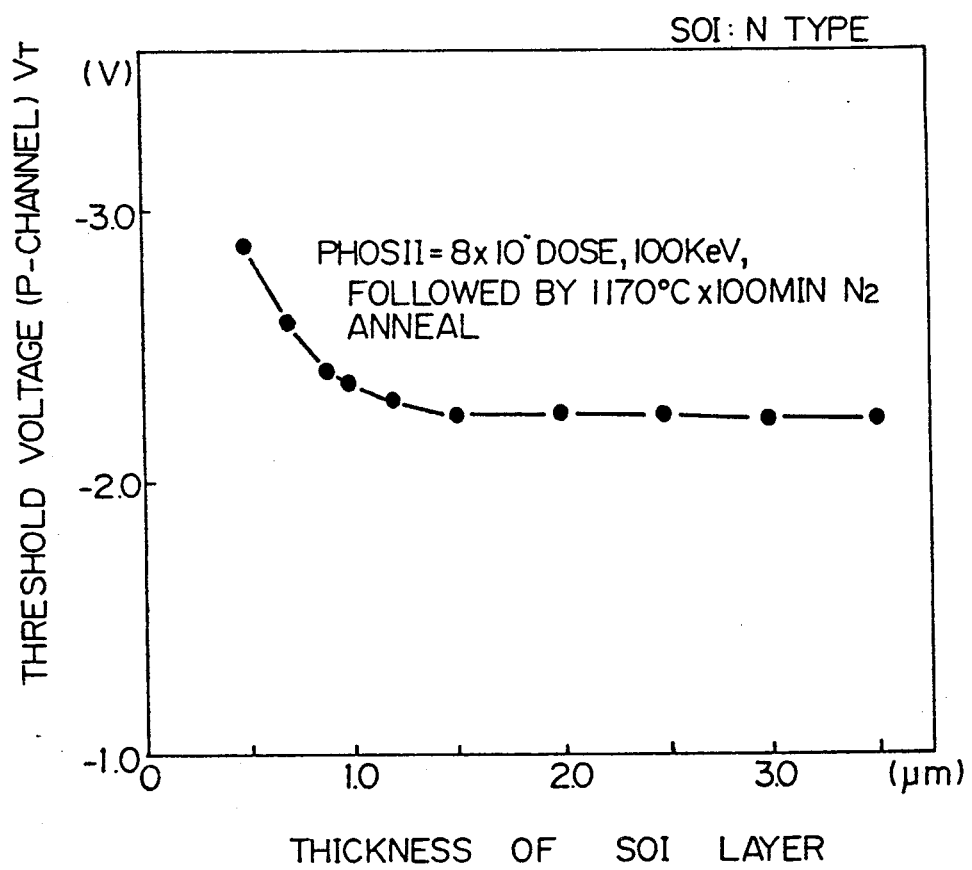

FIGS. 4A and 4B show the threshold voltage $V_t$ of a transistor formed in a driven in SOI layer vs. the thickness of the SOI layer formed on an insulating layer 2 when the drive-in conditions are varied. FIG. 4A shows the relationship between the threshold voltage of an N-type channel transistor vs. the thickness of the island region 6, and FIG. 4B shows the relationship between the threshold voltage of an P-type channel transistor vs. the thickness of the island region 7. FIGS. 4A and 4B are obtained by a simulation under the conditions that, in the above embodiment, the first single crystalline silicon substrate 1 has an N-type conductivity and a resistivity of 3-5 $\mu$cm, the thickness of the gate oxide layer 10 is 85 nm, the dose of the B (boron) is $4 \times 10^{12}$ cm$^{-2}$, and the acceleration voltage for the B ion implantation is 40 keV. It is generally seen from FIG. 4A that each threshold voltage $V_t$ is first rapidly lowered, then becomes almost constant, and is again lowered. The reason why the threshold voltage is lowered again after becoming almost constant is that, even if the same drive-in conditions are adopted, the impurity cannot reach the bottom of the island region 6 when the thickness of the island region 6 becomes thicker, and an N-type conductivity region then remains adjacent to the bottom of the island region 6, whereby a parasitic transistor is formed and a current leakage occurs.

The reason why the threshold voltage is rapidly lowered when the island region has a thickness of less than 1.5 $\mu$m in FIG. 4A is that, when the thickness of the island region 6 is too thin, the impurity concentration after annealing tends to become uniform in the whole island region 6 and the impurity concentration at the top surface of the island region, most concerned with determining the threshold voltage, is easily varied depending on the thickness of the island region 6, which affects and rapidly varies the threshold voltage. Although when the thickness of the island region 6 is normally thick the impurity concentration at the bottom surface of the island region 6 is sufficiently low in comparison with that at the top surface of the island region 6, when the thickness of the island region 6 is thin, the impurity concentration tends to be made uniform in the island region 6 and the difference in the impurity concentration of the bottom and top surfaces of the island region 6 becomes small. In FIG. 4A, the ratio of the impurity concentration at the bottom to top surfaces of the island region 6 is near one where the threshold voltage is rapidly lowered, but if that ratio is smaller than ratios at points D, E and F of the characteristics curves A, B and C, the impurity concentration at the top surface of the island region 6 is substantially not affected by the thickness of the island region 6 and the threshold voltage is therefore almost constant. Since the ratio of the impurity concentration at the bottom to top surfaces of the island region 6 is 0.822 at the point D, 0.824 at the point E, and 0.92 at the point F, the impurity concentration at the top surface of the region is not substantially varied and a dispersion of the threshold voltage can be prevented if the above ratio is not more than about 0.8. This is also understood from FIG. 5, which plots that ratio, calculated from the data in FIG. 4A, on the abscissa.

In the above embodiment, since the thickness of the island regions 6 and 7 is made 1.5-2.5 μm, and the drive-in conditions are 1170° C. and 100 minutes, the impurity concentration ratio is less than 0.8, as seen in FIG. 4A, and thus the threshold voltage is stable and current leakage does not occur. For example, by selecting the design thickness of the island regions 6 and 7 as 2.0 μm, the threshold voltage is always almost 2.0 V even if a dispersion of the thickness of the regions after polishing is +0.5 μm, and thus a semiconductor device having good characteristics is obtained.

In the above embodiment, the following design advantages are resulted from the fact that the conductivity type of the gate electrode 11a is the same as that of the first single crystalline substrate 1. The work function of the N-type polycrystalline silicon gate electrode is 4.1 V and that of the P-type is 5.3 V; a difference of about 1.2 V. For example, as in the above embodiment, when a first single crystalline substrate 1 having an N-type conductivity is used, a P-type impurity must be introduced into the island region 6 of the N-type channel transistor, selected from the CMOS transistor, to convert the conductivity type from N-type to P-type. The concentration of the impurity introduced into the island region 6 is desirably higher, so that the impurity is easily diffused deeper, i.e., toward the bottom of the island region 6, to prevent the occurrence of a current leakage. If the conductivity type of the gate electrode 11a is N-type, an excess work function of 1.2 V exists in comparison with when it is P-type, and therefore, the impurity can be introduced at a higher concentration corresponding to that excess work function, which allows a deeper diffusion of the impurity and an easy control of the threshold voltage, whereby a design advantage is obtained.

Figure 6:
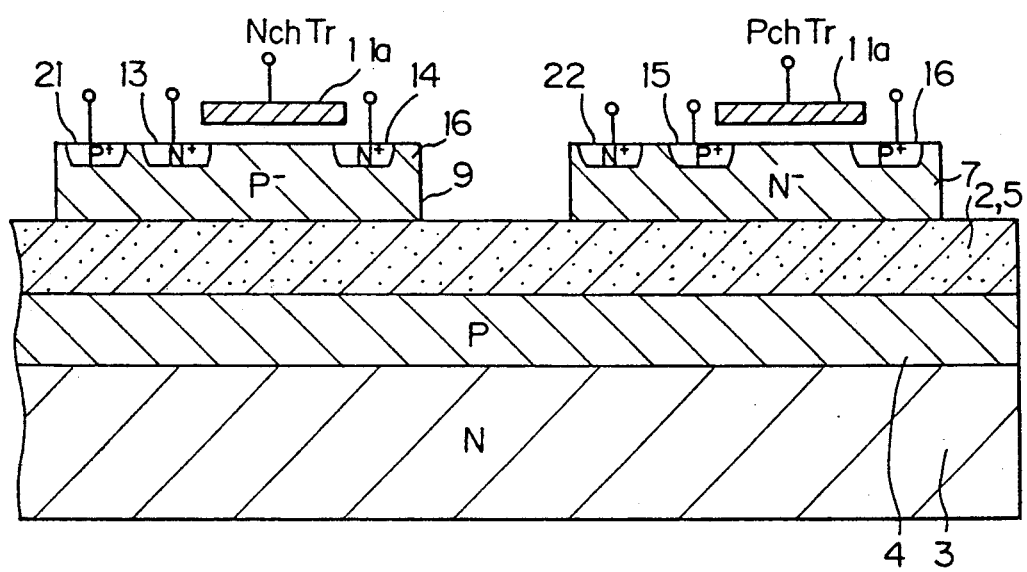
FIG. 6 is a sectional view of a semiconductor device of another embodiment.

In this embodiment, for setting a substrate potential of the P-type and N-type channel transistors of the CMOS transistor, the substrate potentials of the both transistors are made common with a capacitor coupling by the P-type region 4 through the oxide layers 2 and 5, whereby an integration can be accomplished. In such a structure wherein a substrate potential of a transistor is set by a capacitor coupling, a 'kink phenomenon' may sometime occur. If the kink phenomenon is an obstacle to a circuit, a structure as shown in FIG. 6 may be formed, i.e., the substrate potentials of the islands regions 6 and 7 are separately set through the contacts 21 and 22. The potential of the P-type region 4 is usually set to the ground (GND) level. When an element, such as the DMOS transistor, comprising a current path in the direction of the thickness of the second single crystal substrate with an electrode on the opposite main surface of the second single crystal substrate is formed in the second single crystal substrate, the conductivity of the P-type region 4 is desirably opposite to that of the second single crystal substrate, to prevent an affect of a variation of the potential of that element to the P-type region.

In the above embodiment, the P-type region 4 is formed by implanting ions in the second single crystal substrate over the entire main surface thereof, as described with reference to FIG. 3A. This is because, if the P-type region 4 is locally formed under the CMOS transistor, the up and down aligning movements for a mask alignment become a problem.

Another embodiment is described with reference to FIGS. 7A-7G.

Figure 7A:
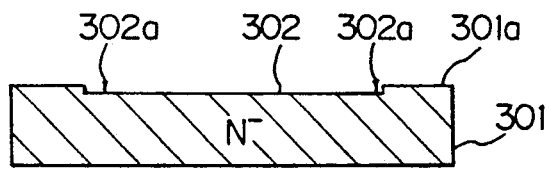

Referring to FIG. 7A, at least one main surface of an $N^-$-type first semiconductor substrate 301 having an impurity concentration of $5 \times 10^{15}$ cm$^3$ is mirror-polished and a portion of the mirror-polished surface 301a of the substrate 301 is chemically or reactive ion etched to form a recess 302 having a depth of 0.2-2 μm.

Figure 7B:
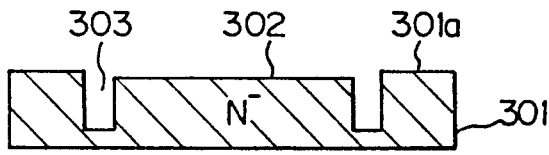

Referring to FIG. 7B, grooves 303 having a width of more than 2 μm and a depth of more than 10 μm, and extending along the periphery 302a of the recess 302 to the end of the substrate 301, are formed by a dicing, chemical etching, or reactive ion etching. This first substrate 301 and an $N^+$-type second semiconductor substrate 305, at least one surface of each of which is mirror-polished, are thoroughly cleaned, for example, by sequentially carrying out a trichlene boiling, a super sonic washing in acetone, a removal of organic materials by a mixture of $NH_3 H : H_2O_2 = 1 : 1 : 4$, a removal of contaminated metals by a mixture of $HCl : H_2O_2: H_2O = 1 : 1 : 4$, and a pure water cleaning. Then, an oxide layer of the substrates or wafers is removed by a mixture of $HF : H_2O = 1 : 50$, an oxide layer less than 1.5 nm thick is formed on the surface of the substrates by, for example, a mixture of $H_2SO_4: H_2O_2O = 3 : 1$, to give a hydrophilic property, and then cleaning with pure water is carried out. Then drying with a dry nitrogen or the like is carried out to remove water adsorbed to the surface of the substrates.

Figure 7C:
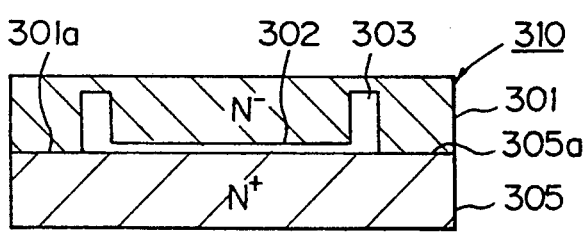

Then, as shown in FIG. 7C, the mirror-polished surfaces 301a and 305a of the substrates 301 and 305 are brought into contact with each other. Accordingly, the surfaces 301a and 305a of the substrates 301 and 305 are adhered by a hydrogen bond of silanol groups on the surface and water molecules adsorbed to the surface of the substrates. The adhered substrates 301 and 305 are dried in air under a vacuum of less than 10 Torr, and during this drying, a weight of more than 30 gf/cm$^2$ may be applied, to prevent a bending of the substrates 301 and 305. The substrates 301 and 305 are then heat-treated in an inert atmosphere such as nitrogen or argon, at a temperature higher than 1100° C. for more than 1 hour, whereby a dehydrogen condensation occurs at the adhered surfaces to form a bond between a silicon and oxygen, Si—O—Si, and a diffusion of oxygen into the substrates follows to leave a bond between silicon atoms, Si—Si, thus forming a direct bond between the substrates 301 and 305 and forming a bonded substrate 310. The recess 302 is not bonded and remains as a free space.

Also referring to FIG. 7D, the bonded substrate 310 is then heat treated in an oxidizing atmosphere, such as a dry $O_2$, a wet $O_2$, or a burning gas of mixed $O_2$ and $H_2$, at a temperature higher than 900° C. for more than 1 hour, to oxidize the surfaces of the recess inside the substrate 310 through the groove 303 and form an oxide layer 311. This oxidation is carried out at least until oxide layers are grown on the surfaces of the recess 302 and the substrate 305 to fill the recess 302 with the oxide layers and to form a bond of Si and O, to thereby completely bond the surfaces of the recess 302 and the substrate 305 together. To accelerate the oxidation of the recess portion, oxygen may be ion implanted into the recess portion 302 before the substrates are brought into contact with each other (in the step of FIG. 7A or 7B).

Referring to FIG. 7E, the surface 301b, i.e., the substrate 301 side, of the substrate 310 is polished or etched to expose the grooves 303, and then the thickness of the substrate 301 is made about 5 μm.

Referring to FIG. 7F, the grooves 303 are filled, for example, by depositing polycrystalline silicon 315 by CVD. Alternatively, the polycrystalline silicon 315 may be an insulating material such as an oxide or a nitride, and may be deposited by sputtering, vacuum deposition or SOG. The deposition may not completely fill the grooves 303 and may leave a space in the grooves 303, as long as the tops of the grooves 303 are closed.

Then, for example, a lap polishing or etching back is carried out to remove the deposit on and planarize the surface 320, whereby a semiconductor substrate 310 having a region completely electrically isolated by the filler 315 and the oxide layer 311 is obtained.

Then, as shown in FIG. 7G, a vertical-type power transistor 330 and a logic circuit 335 for controlling the transistor 330 are formed in a one-chip semiconductor substrate 310.

To form the vertical-type power transistor 330, a source electrode 331 and a gate electrode 332 are formed on the end surface of the substrate 301, and a drain electrode 333 on the end surface of the substrate 305.

In the logic circuit 335, N-type and P-type impurities are ion implanted to a region 320 at the end surface of the substrate 301, followed by a heat treatment at 1170° C. for 10 hours for a drive-in to form an N-type well region 336 having an impurity concentration of $2 \times 10^{16}$ cm$^{-3}$ and a P-type well region 337 having an impurity concentration of $7 \times 10^{16}$ cm$^{-3}$, respectively. The impurity of the each region 336 or 337 reaches from the top to bottom surfaces of the region 320 and has a concentration inclination gradually decreasing from the top to bottom surfaces. The ratio of the impurity concentration of the bottom to top surfaces is adjusted to not more than 0.8. In each region 336 or 337, P$^+$-type and N$^-$-type regions are formed to form source and drain regions, and then a gate electrode is formed over an insulating layer, whereby a logic circuit having a CMOS transistor is formed.

Also, in this embodiment, since the CMOS transistor 335 is formed in a substrate 301 having a thickness as thin as about 5 μm, the depth of the grooves 303 electrically isolating the CMOS transistor and the vertical power transistor 330 is very shallow, so that the time required for the processing step can be shortened and the productivity can be improved. Since the impurities in the N-type well region 336 and P-type well region 337 reach the bottom of the region 320, this prevents the formation of a parasitic transistor, and since the ratio of the impurity concentration at the bottom to top surfaces is not more than 0.8, a dispersion of the threshold voltage can be controlled.

The present invention has been described with reference to embodiments or examples, but the present invention is not limited to these embodiments or examples and can be modified as follows, for example, without departing from the spirit or concept of the present invention.

1) The element formed in an island region on an insulating layer may be other than an MOS transistor, and may be another insulating gate-type field effect transistor which generates a current leakage depending on the electrode structure, and may also include a passive element such as a resistor or a diode.

2) The insulating layer between the first and second single crystalline substrates may be derived from an insulating layer formed on at least one of the first and second single crystalline substrates, and not necessarily on both.

3) In the embodiment shown in FIGS. 3A-3I, although the electrical insulating between the N-type and P-type channel transistors is formed by locally etching the first single crystalline substrate, it may be formed by a trench technique or by a local oxidization if the thickness of the island region is sufficiently thin.

We claim:

1. A semiconductor device comprising:
    a substrate having a main surface,
    an insulating layer formed on the main surface of the substrate, and
    a semiconductor region of a single crystal formed on the insulating layer,
    wherein said semiconductor region has top and bottom surfaces and a thickness of not more than 6μm, said thickness varying due to circumstances of formation and an impurity being doped in said semiconductor region from the top to bottom surfaces thereof, a concentration of said impurity gradually decreasing from the top to bottom surfaces, whereby said semiconductor region is rendered a first conductivity type by said doped impurity, and
    an insulating gate type field effect transistor including source and drain regions formed in said semiconductor region, said source and drain regions having a conductivity type opposite to that of the first conductivity type, said field effect transistor having a threshold voltage,
    wherein the gradual decrease of the impurity concentration from the top to bottom surfaces of the semiconductor region is defined so as to prevent any effect on said threshold voltage by said varying thickness of the semiconductor region.

2. A device according to claim 1 wherein said gradual decrease of the impurity concentration is such that a ratio of doped impurity concentration at the bottom to top surfaces of the semiconductor region is not more than 0.8.

3. A device according to claim 1 wherein a CMOS transistor is also formed in said semiconductor region.

4. A device according to claim 3 wherein said semiconductor region is formed as separated islands, and P-type and N-type channel transistors of said CMOS transistor are formed electrically isolated from one another by forming said P-type and N-type channel transistors in said islands of said semiconductor region, respectively.

5. A device according to claim 3 wherein P-type and N-type channel transistors of said CMOS transistor are electrically isolated by forming a trench between said P-type and N-type channel transistors.

6. A semiconductor device comprising:
    a substrate having a main surface,
    an insulating layer formed on the main surface of the substrate, and a semiconductor region of a single crystal formed on the insulating layer, said thickness varying due to circumstances of formation, wherein said semiconductor region has top and bottom surfaces and an impurity is doped in said semiconductor region from the top to bottom surfaces thereof, a concentration of said impurity gradually decreasing from the top to bottom surfaces, whereby said semiconductor region is rendered a first conductivity type by said doped impurity, a ratio of doped impurity concentration at the top to bottom surfaces of the semiconductor region being not more than 0.8, and an insulating gate type field effect transistor including source and drain regions in said semiconductor region, said source and drain regions having a second conductivity type opposite to that of the first conductivity type, wherein said field effect transistor has a threshold voltage which is stable with respect to said variation of the thickness of said semiconductor region, ensured by said gradual decrease of the impurity concentration in said semiconductor region.

7. A device according to claim 6, wherein said semiconductor region has a thickness of not more than 6 μm.

8. A device according to claim 6 wherein a CMOS transistor is also formed in said semiconductor region.

9. A device according to claim 8 wherein said semiconductor region is formed as separated islands, and P-type and N-type channel transistors of said CMOS transistor are electrically isolated by forming said P-type and N-type channel transistors in said islands of said semiconductor region, respectively.

10. A device according to claim 8 wherein P-type and N-type channel transistors of said CMOS transistor are electrically isolated by forming a trench between said P-type and N-type channel transistors.

11. A device according to claim 1 wherein said substrate is composed of a single crystalline semiconductor having a first conductivity type, said main surface of said substrate is divided into a first area on which said insulating layer is formed and a second area on which said insulating layer is not formed, further comprising an electrode provided on another main surface, opposite to said main surface, of said substrate, and a semiconductor element formed on said second area of said semiconductor region, said semiconductor element using said electrode formed on said another surface of said substrate as an electrode thereof and having an electric current passing in a direction of the thickness of said substrate.

12. A device according to claim 11, wherein said substrate has a doped region having a second conductivity type opposite to said first conductivity type under and adjacent to said insulating layer in said first area of said substrate.

13. A device according to claim 6 wherein said substrate is composed of a single crystalline semiconductor having a first conductivity type, said main surface of said substrate is divided into a first area on which said insulating layer is formed and a second area on which said insulating layer is not formed, further comprising an electrode provided on another main surface, opposite to said main surface, of said substrate, and a semiconductor element formed on said second area of said semiconductor region, said semiconductor element using said electrode formed on said another surface of said substrate as an electrode thereof and having an electric current passing in a direction of the thickness of said substrate.

14. A device according to claim 13, wherein said substrate has a doped region having a second conductivity type opposite to said first conductivity type under and adjacent to said insulating layer in said first area of said substrate.

15. A semiconductor device having a substrate having an insulating surface comprising:

a semiconductor region of a single crystal formed on said insulating surface of said substrate, wherein said semiconductor region has a thickness which varies due to circumstances of formation, and has top and bottom surfaces, and an impurity being doped in said semiconductor region from the top to bottom surfaces thereof, a concentration of said impurity gradually decreasing from the top to bottom surfaces, whereby said semiconductor region is rendered a first conductivity type by said doped impurity, and an insulating gate type field effect transistor including source and drain regions formed in said semiconductor region, said source and drain regions having a second conductivity type opposite to that of the first conductivity type, said field effect transistor having a threshold voltage, wherein the gradual decrease of the impurity concentration from the top to bottom surfaces of the semiconductor region is defined so as to prevent an effect on a threshold voltage by said variation of said thickness of the semiconductor region.

* * * * *